(12) United States Patent
Lee (10) Patent No.: US 6,472,313 B2
(45) Date of Patent: Oct. 29, 2002

(54) DEVICE FORMATION METHOD FOR PREVENTING PATTERN SHIFT CAUSED BY GLASS LAYER REFLOW

(75) Inventor: Sung-Kwon Lee, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/929,338

(22) Filed: Aug. 15, 2001

(65) Prior Publication Data

US 2002/0025647 A1 Feb. 28, 2002

(30) Foreign Application Priority Data

Aug. 31, 2000 (KR) ............................................. 00-51331
Aug. 31, 2000 (KR) ............................................. 00-51370

(51) Int. Cl.⁷ ............................................. H01L 21/44
(52) U.S. Cl. .................... 438/633; 438/653; 438/675; 438/763
(58) Field of Search ................. 438/632, 624, 438/783, 195, 633, 653, 666, 675, 763, 667, 700, 629, 625

(56) References Cited

U.S. PATENT DOCUMENTS

| | | | | |
|---|---|---|---|---|
| 5,087,591 A | * | 2/1992 | Teng | 216/18 |
| 5,094,900 A | * | 3/1992 | Langley | 257/368 |
| 5,225,372 A | * | 7/1993 | Savkar et al. | 257/753 |
| 5,652,182 A | * | 7/1997 | Cleeves | 438/631 |
| 5,981,377 A | * | 11/1999 | Koyama | 438/633 |
| 6,218,289 B1 | * | 4/2001 | Wu | 438/624 |

* cited by examiner

Primary Examiner—Michael S. Lebentritt
(74) Attorney, Agent, or Firm—Jacobson Holman PLLC (57) ABSTRACT

A semiconductor device formation method for preventing pattern shift caused by reflow of a glass layer in subsequent thermal processes. An insulating layer having thermal stability at a glass layer reflow temperature of 700° C.–1,000° C. is deposited over a semiconductor substrate to cover a resulting structure formed on the semiconductor substrate. Subsequently, a glass layer is deposited on the insulating layer to planarize topologies, and the glass layer is selectively removed to expose parts of the insulating layer with which conducting patterns are to be contacted. Thereafter, a conducting pattern is formed on the exposed parts of the insulating layer. Using the method, it is possible to prevent the shift of the conducting pattern because the conducting patterns are in contact with the insulating layer having thermal stability.

9 Claims, 7 Drawing Sheets

DEVICE FORMATION METHOD FOR PREVENTING PATTERN SHIFT CAUSED BY GLASS LAYER REFLOW

FIELD OF THE INVENTION

The present invention relates to a method for manufacturing semiconductor devices and, more particularly, to a method for manufacturing a semiconductor device which is capable of preventing pattern shift caused by the reflow of a glass layer during subsequent thermal processes.

DESCRIPTION OF THE PRIOR ART

There has been great progress in the field of integrated circuit (IC) fabrication, with the trend having been to reduce the size of semiconductor devices. In addition, multiple layers of interconnections between devices, such as ULSI (ultra large scale integration) devices, are now used. A subsequent layer is generally formed on an underlying layer. In order to achieve a better topography, a planarization process is quite often used to obtain a planar surface. Thus, planarization is the key way to make sure that a layer has a planar surface. If one of the multiple layers has poor topography, then this results in alignment problems for subsequent layers.

Typically, during the formation of ICs, a glass layer, such as a borophosphosilicate glass (BPSG) layer, is used as an interlayer dielectric. The BPSG layer is applied in liquid form and therefore exhibits good planarization capabilities. The BPSG layer is also a silicon oxide layer, with specific concentrations of $SiO_2$, $B_2O_3$ and $P_2O_5$, and is formed by the silicon oxide layer deposition process to which are added dopant gases, such as phosphine($PH_3$) and diborane($B_2H_6$).

As the integration of devices is increased, not only are cell regions reduced, but the design rule of a periphery region is also reduced. Therefore, various problems are newly generated in sub-micron devices. For example, conducting patterns, which are formed on the BPSG layer in the periphery region, are moved during the BPSG layer reflow process.

Figure 1:
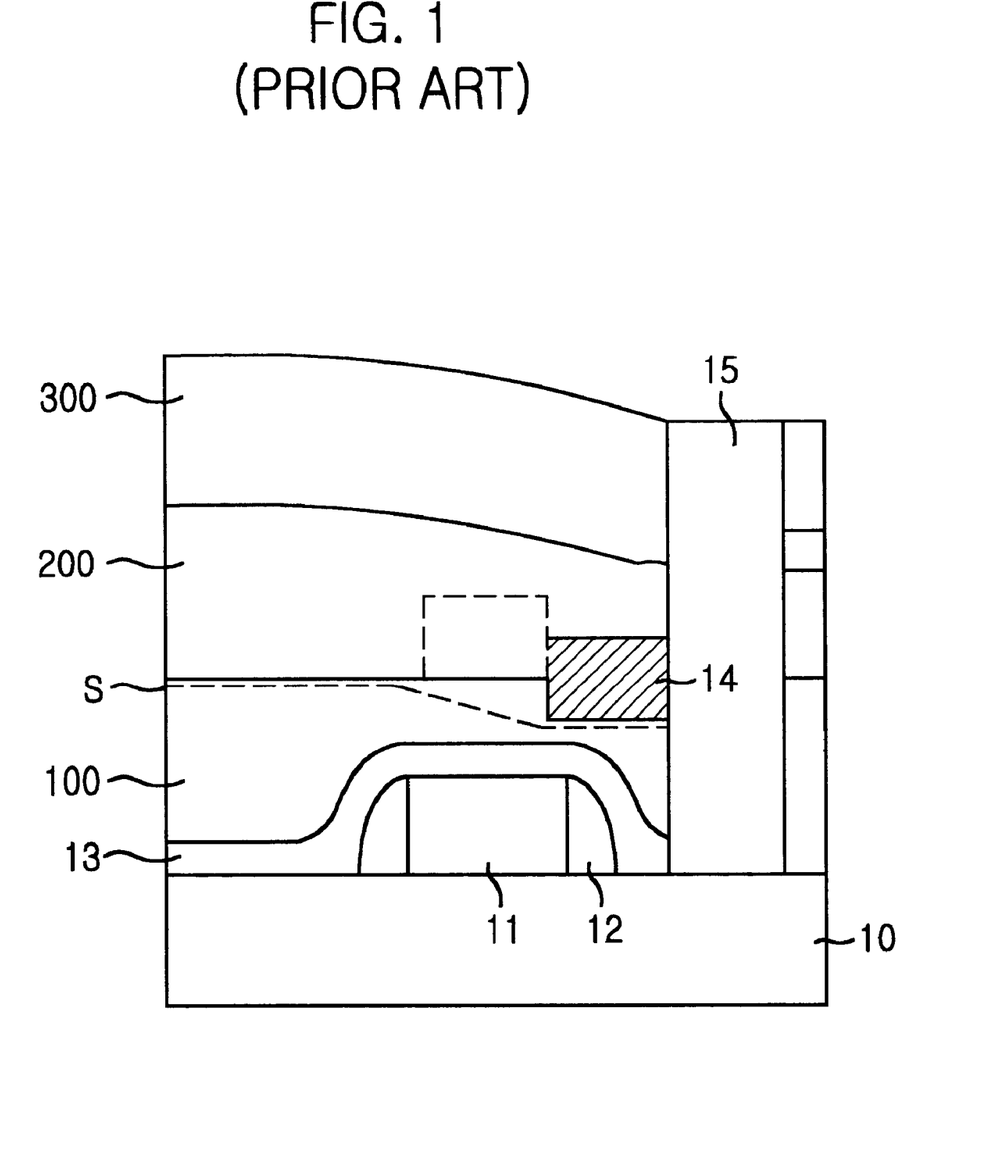
FIG. 1 is a cross-sectional view showing a reflow of a conventional first BPSG layer due to subsequent thermal processes.

Referring to FIG. 1, a conducting pattern 14 formed on a first BPSG layer 100 is shifted, because the first BPSG layer 100 is reflowed in respective thermal steps of depositing and reflowing a second BPSG layer 200 and a third BPSG layer 300. As a result of the reflowing, the conducting pattern 14 may come in contact with a tungsten plug 15, which is exposed on a sidewall of a contact hole. In FIG. 1, The reference numeral "11" denotes a gate electrode, "12" denotes insulating spacers, "13" denotes an interlayer insulating layer, and the reference numeral "S" denotes a topological variation caused by the reflow of the first BPSG layer 100 in the thermal processes, such as the respective steps of depositing and reflowing the second BPSG layer 200 and the third BPSG layer 300.

If the conducting pattern 14 is made of a silicide, the conducting pattern 14 is shrunk during the thermal process because the volume of a silicide layer is reduced to 98% at the temperature 800° C. As a result, the extent of the shift is increased.

The first BPSG layer 100 is more excessively reflowed in a region where the topological difference is high. Therefore, an unintended interconnection between conducting patterns is generated.

Figure 2:
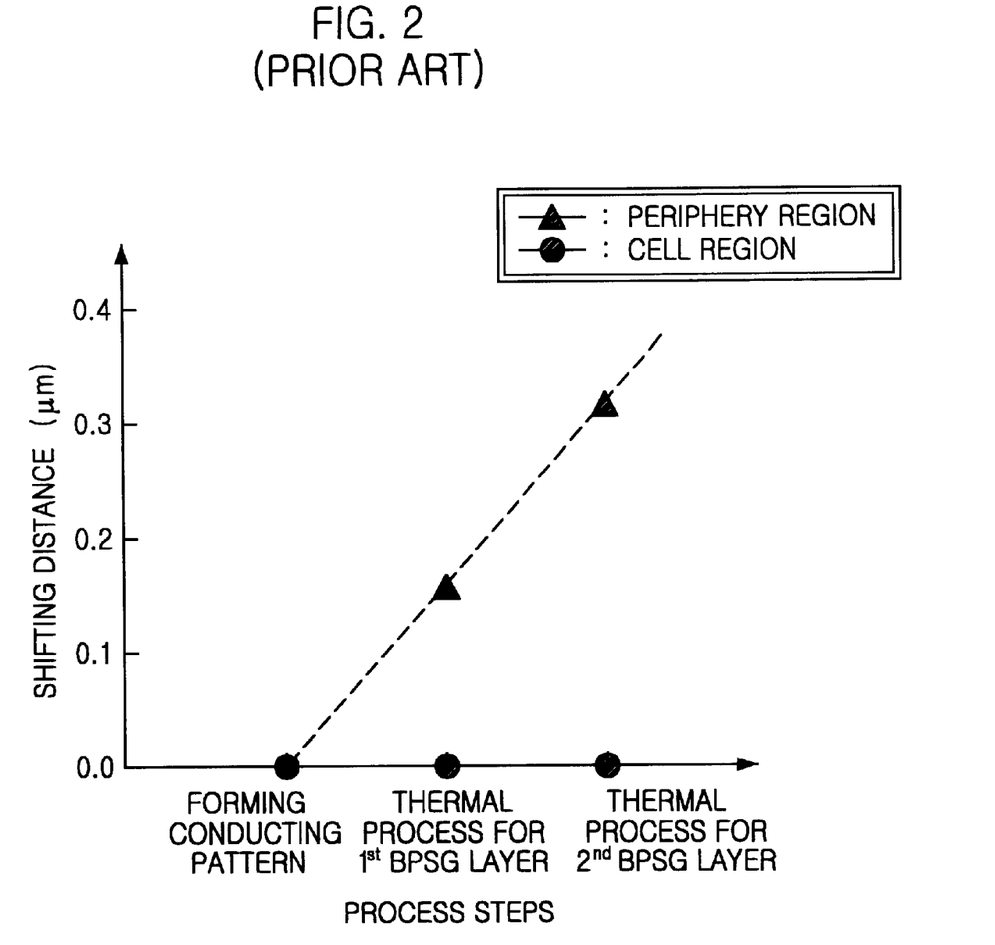
FIG. 2 is a graphical depiction showing shifting distances of conducting patterns on the first BPSG layer after full thermal processes for forming a second and a third BPSG layers, in accordance with a conventional method.

FIG. 2 shows the shifting distance of conducting patterns on a first BPSG layer both in a cell region and a periphery region after a subsequent reflowing process. As shown in FIG. 2, the shifting phenomenon was not observed in the cell region, but only in the periphery region, depending on the topological difference. After the full reflowing process, the shifting distance of the conducting pattern on the first BPSG layer was greater than 0.3 μm.

The conventional method to prevent the reflowing of the first BPSG layer during subsequent thermal processes is to form a TEOS(tetraethylortho silicate) layer having more thermal stability on the BPSG layer. However, the conventional method cannot effectively prevent the shift of the conducting pattern.

SUMMARY OF THE INVENTION

It is, therefore, an object of the present invention to provide a semiconductor device formation method for preventing pattern shift caused by the reflow of a BPSG layer in subsequent thermal processes.

In accordance with an aspect of the present invention, there is provided a method for manufacturing a semiconductor device having multiple layers, by using silicate glass layers for planarizing, comprising steps of a) preparing a substrate provided with lower structures; b) forming an insulating layer over the substrate, wherein the insulating layer is not flowed at reflow temperature of the glass layers; c) forming a first silicate glass layer on the insulating layer; d) selectively removing the first silicate glass, wherein parts of the insulating layers are exposed; and e) forming conducting patterns on the insulating layer in such a way that the conducting patterns are directly contacted with the parts of the insulating layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

A semiconductor device formation method for preventing pattern shift caused by the reflow of a glass layer in subsequent thermal processes is described hereinafter. An insulating layer having thermal stability at a temperature ranging 700° C.–1,000° C., that is the reflowing temperature of the glass layer, is deposited over a semiconductor substrate to cover a resulting structure formed on the semiconductor substrate. Subsequently, a glass layer is deposited on the insulating layer to planarize topologies, and the glass layer is selectively removed to expose parts of the insulating layer with which conducting patterns are to be contacted. Thereafter, a conducting pattern is formed on the parts of the insulating layer. Through such method, it is possible to prevent the shift of the conducting pattern because the conducting patterns are in contact with the insulating layer having thermal stability.

A first embodiment of the present invention is described herein.

Figure 3A:
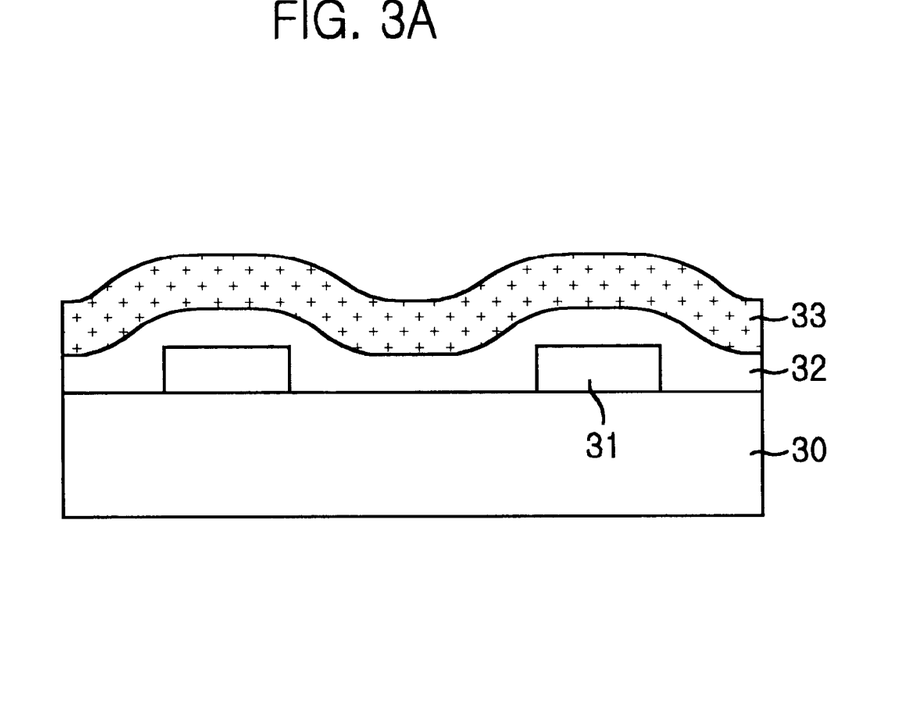
FIGS. 3A to 3D are cross-sectional views showing sequential steps for fabricating a semiconductor device in accordance with a first preferred embodiment of the present invention.

Referring to FIG. 3A, lower conducting patterns 31, such as a gate electrode of a transistor, are formed on a semiconductor substrate 30. Thereafter, a TEOS layer 32 is formed over the semiconductor substrate to insulate between layers. The thickness of the TEOS layer 32 is between about 3000 and 10000 angstroms. Subsequently, a first BPSG layer 33 is formed on the resulting structure. The thickness of the first BPSG layer 33 is between 1000 and 3000 angstroms.

The TEOS layer 32 may be replaced by an $O_3$-TEOS layer, and the first BPSG layer 33 may be replaced by a PSG (phosphosilicate glass) layer or a BSG (borosilicate glass) layer. The TEOS layer 32 is deposited using plasma enhanced chemical vapor deposition (PECVD) or low pressure chemical vapor deposition (LPCVD). The impurity concentration in the first BPSG layer 33 is not more than 10%, and the process of forming the first BPSG layer includes steps of depositing and reflowing.

Figure 3B:
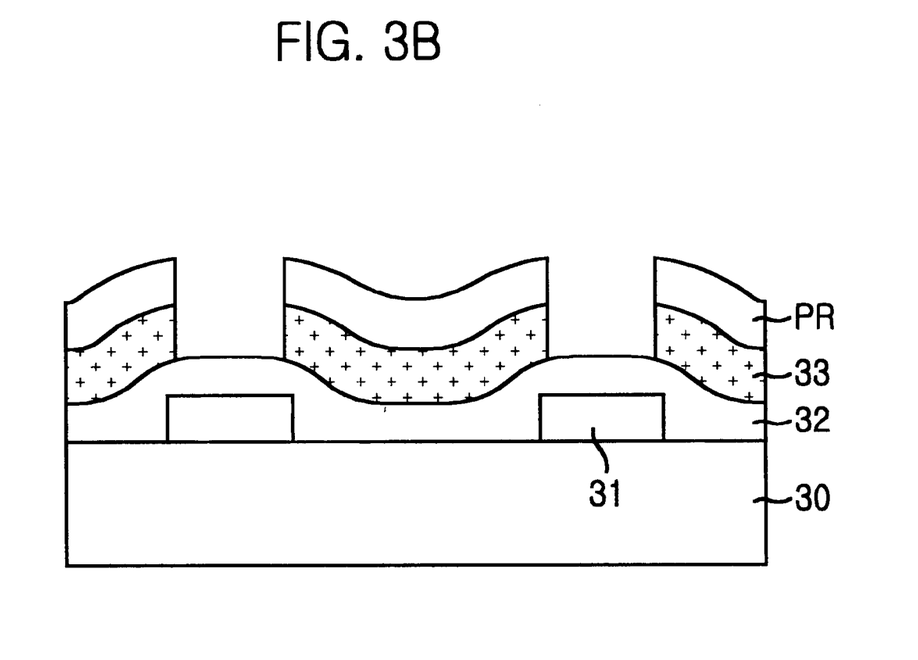

Subsequently, as shown in FIG. 3B, photoresist patterns PR, which define regions of conducting patterns, are formed on the first BPSG layer 33. Thereafter, the first BPSG layer is etched to form openings, which expose parts of TEOS layer 32 with which conducting patterns are to be contacted. The openings may also be formed in a periphery region.

Figure 3C:
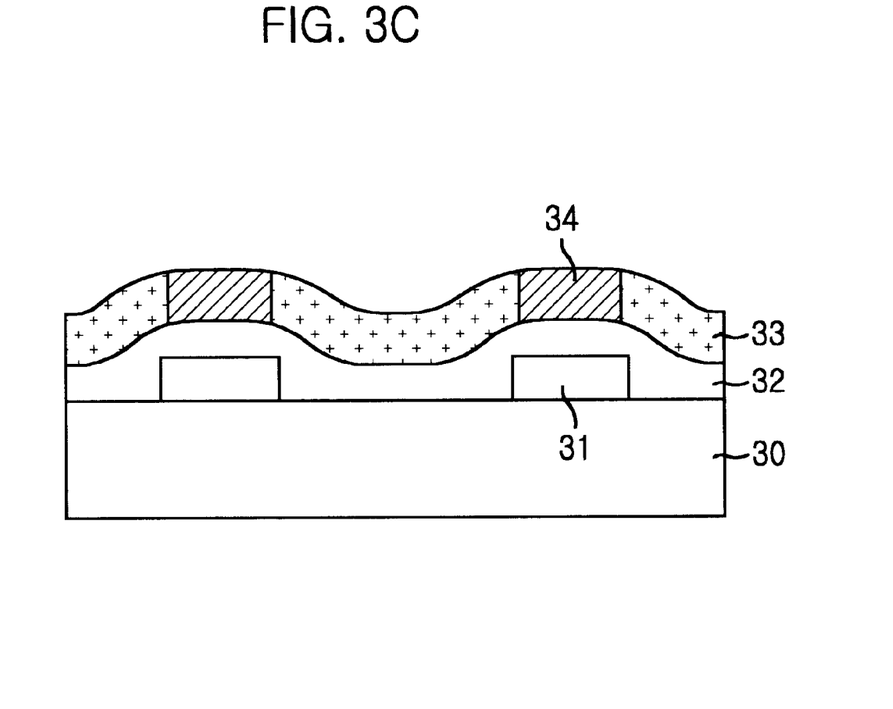

Thereafter, as shown in FIG. 3C, the photoresist patterns PR are removed, and then a conducting layer is deposited to fill the openings. Subsequently, the conducting layer is removed by a plasma etching or a CMP (chemical mechanical polishing) until surfaces of the first BPSG layer 33 are exposed. As a result, the conducting layer remains only in the openings, thereby forming upper conducting patterns 34 contacted with the TEOS layer 32. The upper conducting patterns 34 may serve as a power supply line and may be formed with various materials, such as polysilicon, polycide, aluminum, cobalt silicide, chromium silicide, tungsten silicide, titanium silicide, or nickel silicide.

Figure 3D:
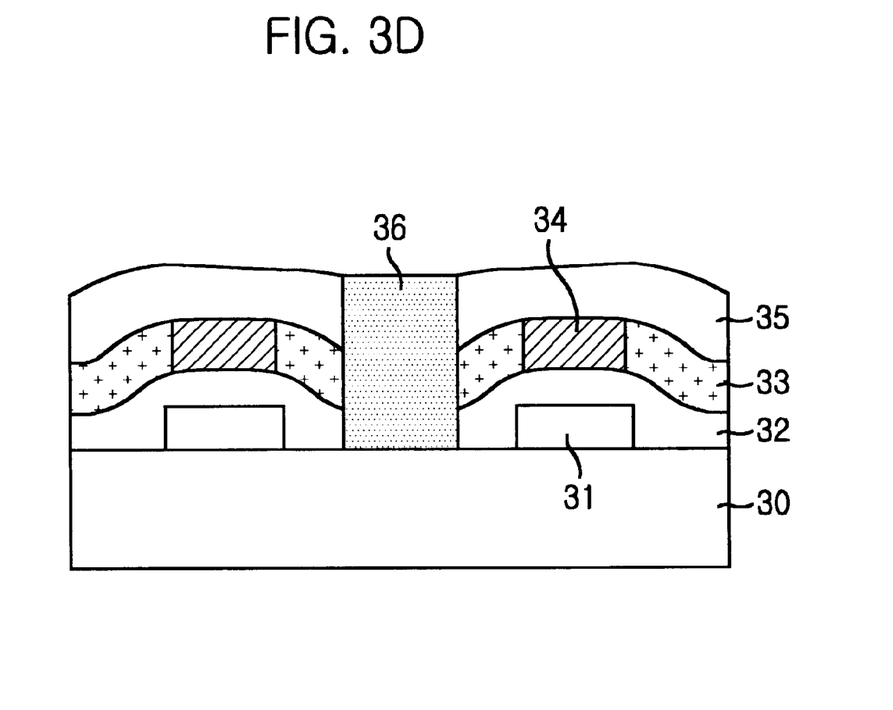

Subsequently, as shown in FIG. 3D, a second BPSG layer 35, of which the impurity concentration is not more than 10%, is formed on the resulting structure. Thereafter, the second BPSG layer 35, first BPSG layer 33 and the TEOS layer 32 are selectively etched to form a contact hole exposing the semiconductor substrate 30. After that, succeeding processes, such as forming plug 36 in the contact hole, a third BPSG layer and fourth BPSG layer, are performed. The process of forming the second BPSG layer 35 also includes steps of depositing and reflowing.

A second embodiment of the present invention is described hereinafter.

Figure 4A:
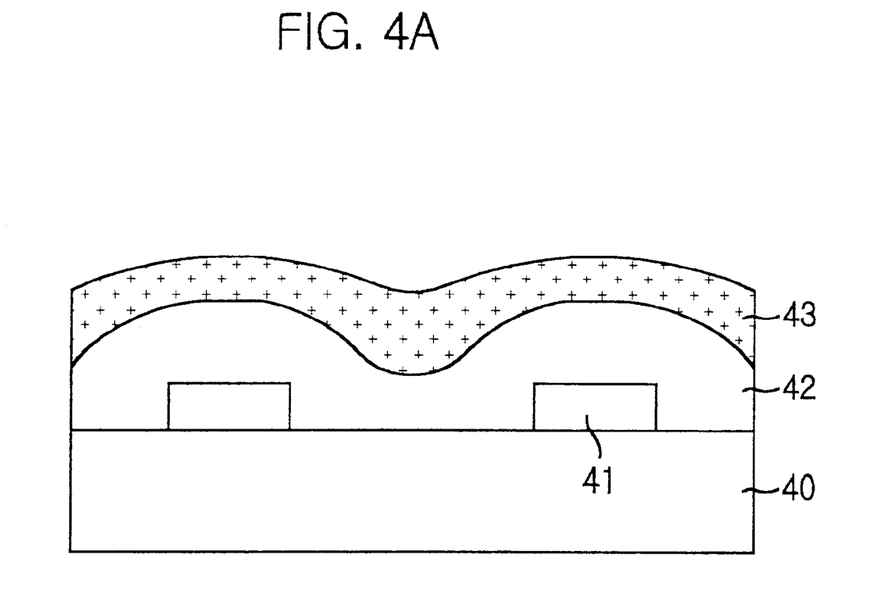
FIGS. 4A to 4D are cross-sectional views showing sequential steps for fabricating a semiconductor device in accordance with a second preferred embodiment of the present invention.

Referring to FIG. 4A, lower conducting patterns 41, such as a gate electrode of a transistor, are formed on a semiconductor substrate 40. Thereafter, a TEOS layer 42 is formed over the semiconductor substrate to insulate between layers. The thickness of the TEOS layer 42 is between about 3000 and 10000 angstroms. Subsequently, a first BPSG layer 43 is formed on the resulting structure. The thickness of the first BPSG layer 43 is between 1000 and 3000 angstroms.

The TEOS layer 42 may be replaced by an $O_3$-TEOS layer, and the first BPSG layer 43 may be replaced a PSG layer or a BSG layer. The TEOS layer 42 is deposited using PECVD or LPCVD. The impurity concentration in the first BPSG layer 43 is not more than 10%, and the process of forming the first BPSG layer includes steps of depositing and reflowing.

Figure 4B:
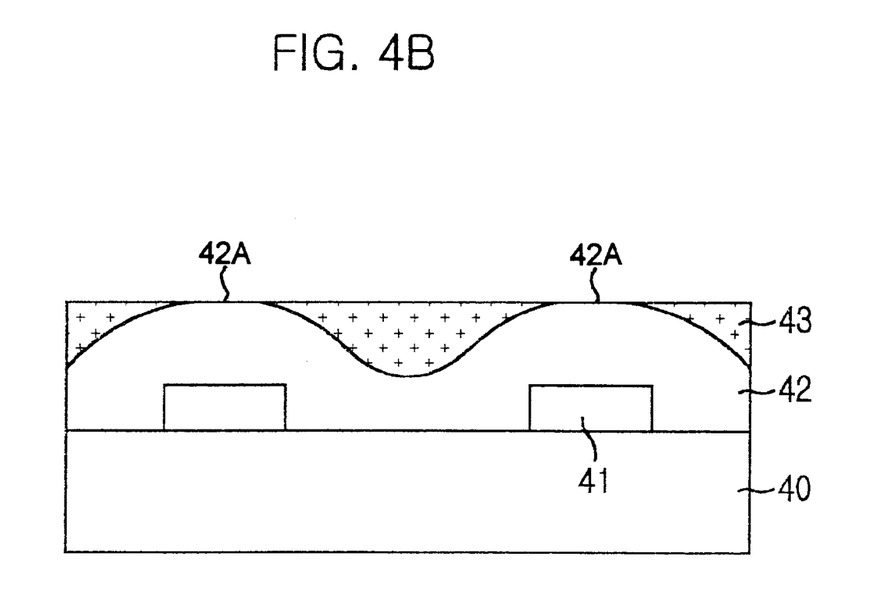

Subsequently, as shown in FIG. 4B, the first BPSG layer 43 is removed by a plasma etching or a CMP until peak parts 42A of the TEOS layer 42 are exposed. The peak parts 42A for the TEOS layer 42 are to be contacted with conducting patterns. The BPSG layer 43 remains at valley regions between the peak parts of the TEOS layer, and the BPSG layers in respective valley regions are not connected with each other.

Figure 4C:
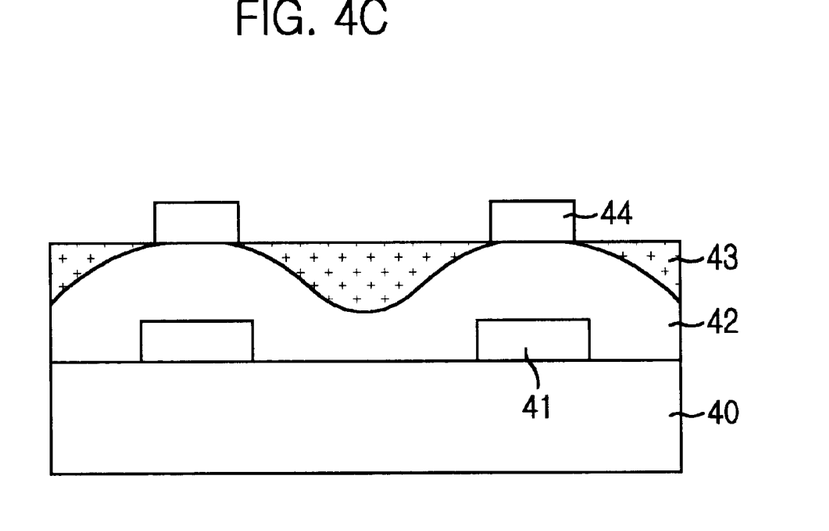

Thereafter, as shown in FIG. 4C, upper conducting patterns 44 is formed to contact with the TEOS layer 42. The conducting patterns 44 may serve such as a power supply line and may be formed with various materials, such as polysilicon, polycide, aluminum, cobalt silicide, chromium silicide, tungsten silicide, titanium silicide, or nickel silicide.

Figure 4D:
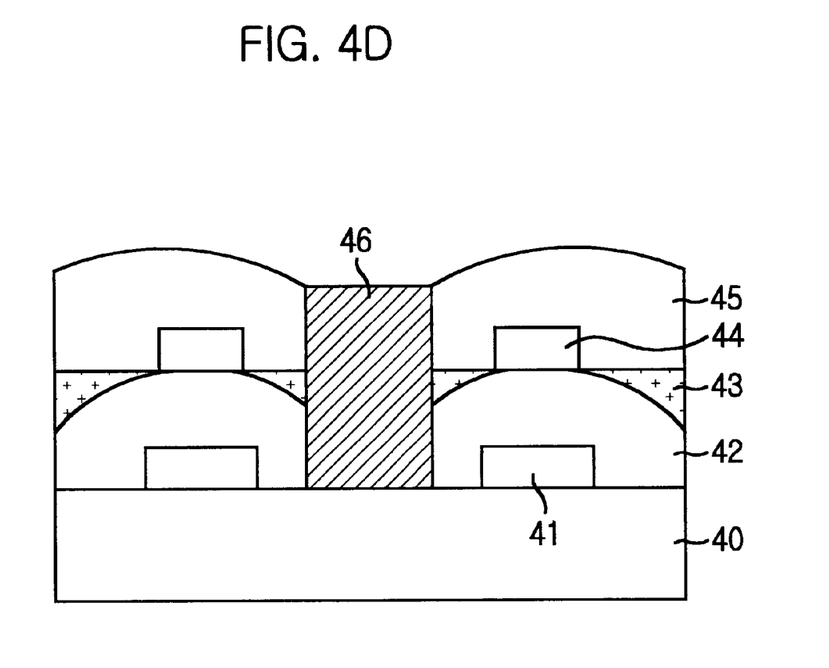

Subsequently, as shown in FIG. 4D, a second BPSG layer 45, of which the impurity concentration is not more than 10%, is formed on the resulting structure. Thereafter, the second BPSG layer 45, first BPSG layer 43 and the TEOS layer 42 are selectively etched to form a contact hole exposing the semiconductor substrate 40. After that, succeeding processes, such as forming plug 46 in the contact hole, a third BPSG layer and fourth BPSG layer, are performed. The process of forming the second BPSG layer 45 also includes steps of depositing and reflowing.

Figure 5:
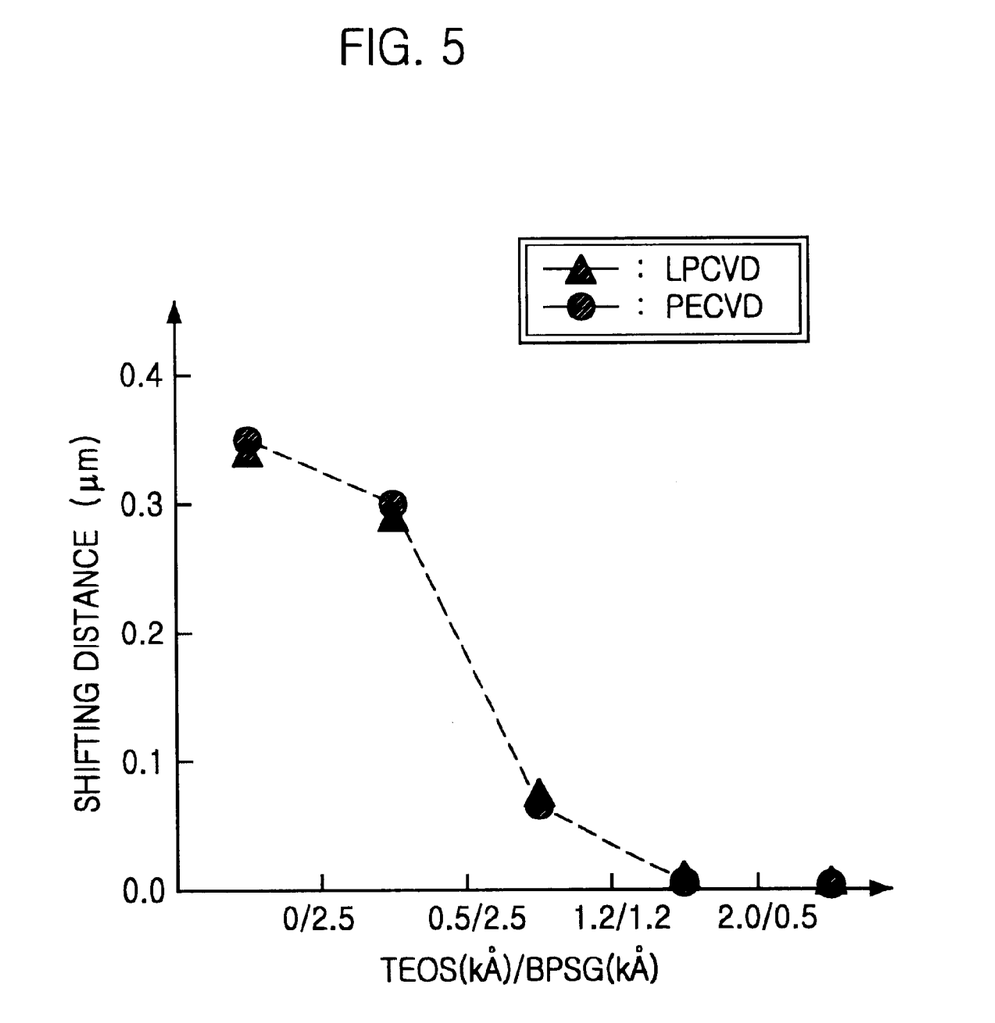
FIG. 5 is a graphical depiction showing shifting distances of conducting patterns as a function of the thickness of a TEOS layer and a BPSG layer.

FIG. 5 is a graphical depiction showing the shifting distance of conducting patterns as a function of the thickness of a TEOS layer and a BPSG layer. As shown in FIG. 5, as the thickness of the TEOS layer 42 is increased, the shift distance of the upper conducting patterns 44 is decreased. Moreover, the shift distance is about the same whether the TEOS layer is deposited by LPCVD or PECVD.

As mentioned above, the upper conducting layers are formed on the TEOS layer, which rarely flows at the BPSG layer reflow temperature, whereby the shift of the upper conducting layers is effectively prevented during the BPSG layer reflow process.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductors device having multiple layers, by using silicate glass layers for planarizing, comprising steps of:
    a) preparing a substrate;
    b) forming an insulating layer over the substrate, wherein the insulating layer is not flowed at a reflow temperature of the silicate glass layers;
    c) forming a first silicate glass layer on the insulating layer;
    d) selectively removing the first silicate glass to expose parts of the insulating layer and etching the first silicate glass layer until peak parts of a top surface of the insulating layer are exposed; and
    e) forming conducting patterns on the insulating layer in such a way that the conducting patterns are directly in contact with the exposed parts of the insulating layer.

2. The method of claim 1, after the step e), further comprising a step of forming a second silicate glass layer over the substrate.

3. The method of claim 1, wherein the first silicate glass layer includes a material selected from the group consisting of a BPSG (borophosphosilicate glass) layer, a PSG (phosphosilicate glass) layer and a BSG (borosilicate glass) layer.

4. The method of claim 3, wherein the reflow temperature of the glass layers is in a range from 700° C.–1,000° C.

5. The method of claim 4, wherein the insulting layer is a TEOS layer.

6. The method of claim 4, wherein the insulating layer is $O_3$-TEOS layer.

7. The method of claim 1, the step d) comprising a step of selectively etching the first silicate glass layer to form openings, wherein the openings expose the parts of the insulating layer, and wherein the conducting patterns are formed in the openings.

8. The method of claim 1, the step d) including a step of polishing the first silicate glass layer until peak parts of a top surface of the insulating layer are exposed.

9. The method of claim 7, wherein the semiconductor device includes a cell region and a periphery region, and wherein the openings are in the periphery region.

* * * * *